United States Patent
Ueda et al.

(10) Patent No.: US 9,977,044 B2
(45) Date of Patent: May 22, 2018

(54) OPTICAL VELOCITY MEASURING APPARATUS AND MOVING OBJECT

(71) Applicant: HITACHI, LTD., Tokyo (JP)

(72) Inventors: Taishi Ueda, Tokyo (JP); Ryosuke Nakamura, Tokyo (JP); Azusa Amino, Tokyo (JP)

(73) Assignee: HITACHI LTD., Tokyo (JP)

( * ) Notice: Subject to any disclaimer, the term of this patent is extended or adjusted under 35 U.S.C. 154(b) by 0 days. days.

(21) Appl. No.: 15/329,503

(22) PCT Filed: Jul. 30, 2014

(86) PCT No.: PCT/JP2014/069993
§ 371 (c)(1),
(2) Date: Jan. 26, 2017

(87) PCT Pub. No.: WO2016/016959
PCT Pub. Date: Feb. 4, 2016

(65) Prior Publication Data
US 2017/0322232 A1    Nov. 9, 2017

(51) Int. Cl.
| | |
|---|---|
| G01B 11/14 | (2006.01) |
| G01P 3/36 | (2006.01) |
| G01B 11/00 | (2006.01) |
| G01P 15/093 | (2006.01) |
| H01L 27/146 | (2006.01) |

(52) U.S. Cl.
CPC ............. *G01P 3/36* (2013.01); *G01B 11/002* (2013.01); *G01B 11/14* (2013.01); *G01P 15/093* (2013.01); *H01L 27/146* (2013.01)

(58) Field of Classification Search
CPC ...... B25J 9/1676; G05D 1/024; Y10S 901/46; Y10S 901/002; G01B 11/002; G01B 11/14; G01P 3/36; G01P 15/093; H01L 27/146
USPC .......................... 356/28, 335–343, 614–623
See application file for complete search history.

(56) References Cited

U.S. PATENT DOCUMENTS

| | | | |
|---|---|---|---|
| 4,385,830 A | 5/1983 | Webb et al. | |
| 2002/0179819 A1* | 12/2002 | Nahum | G01B 11/002 250/208.1 |

(Continued)

FOREIGN PATENT DOCUMENTS

| | | |
|---|---|---|
| EP | 2725362 A1 | 4/2014 |
| JP | 2007-078358 A | 3/2007 |

(Continued)

Primary Examiner — Hoa Pham
(74) Attorney, Agent, or Firm — Volpe and Koenig. P.C.

(57) ABSTRACT

An optical velocity measuring apparatus which can restrict the effect of rotational motion of a moving object and estimate a velocity of its own with high accuracy, for a moving object with no wheels or a moving object of which the wheels slip includes an imager, provided in a moving object, for imaging a traveling surface such that a shift amount of each pixel at a time when an imaging target surface has shifted varies depending on a position of the pixel within an image, and the optical velocity measuring apparatus acquires a pixel shift amount gradient, which is a change in the shift amount of each pixel with respect to a predetermined axis, from a plurality of images captured by an image capturing device in a time series and a velocity of the moving object from the pixel shift amount gradient is acquired.

10 Claims, 6 Drawing Sheets

(56) References Cited

U.S. PATENT DOCUMENTS

| | | | | |
|---|---|---|---|---|
| 2005/0165517 A1* | 7/2005 | Reich | ............... | A63H 27/04 |
| | | | | 701/11 |
| 2008/0246973 A1* | 10/2008 | Regaard | ............ | B23K 26/04 |
| | | | | 356/615 |
| 2014/0327904 A1* | 11/2014 | Bossert | ............... | G01S 17/95 |
| | | | | 356/28 |

FOREIGN PATENT DOCUMENTS

| | | |
|---|---|---|
| JP | 2010-019640 A | 1/2010 |
| JP | 2011-209825 A | 10/2011 |
| JP | 2013-003110 A | 1/2013 |

\* cited by examiner

[Fig. 1]
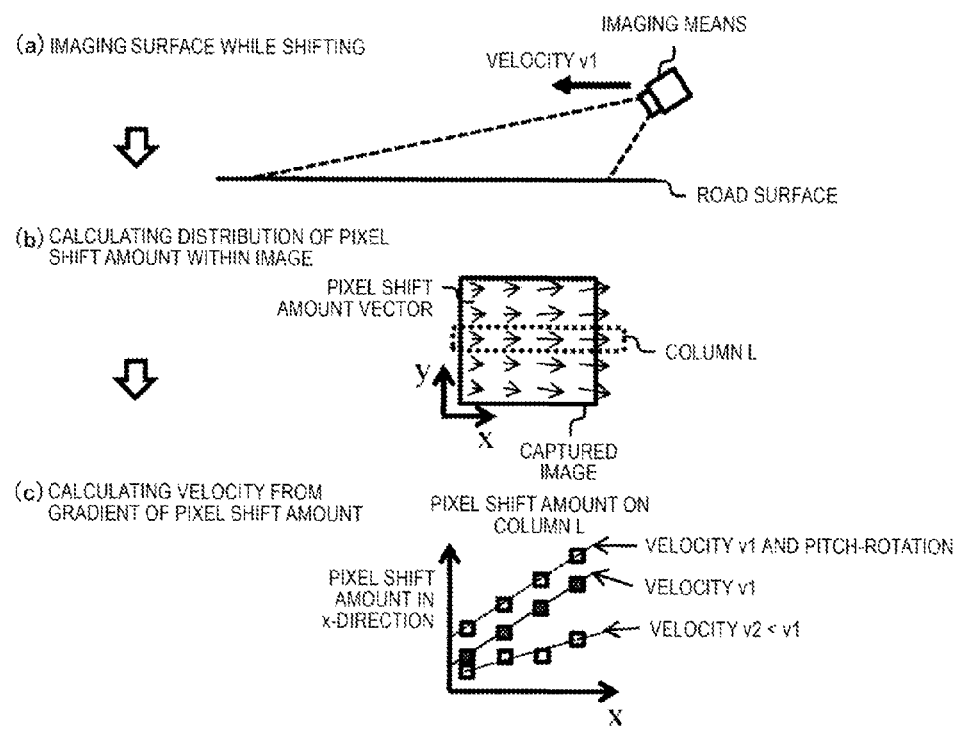
[Fig. 2]
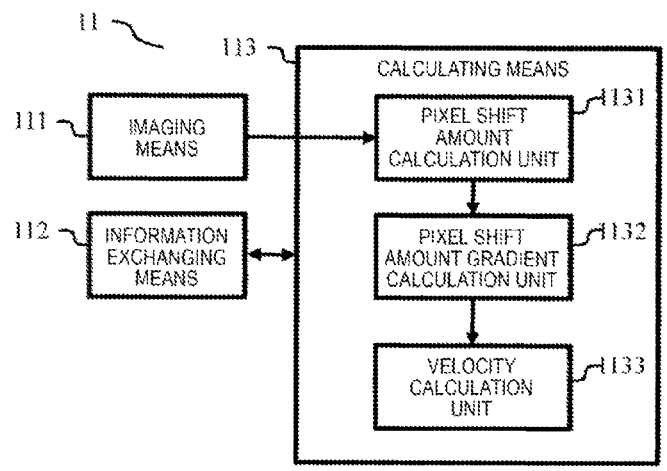

[Fig. 3]
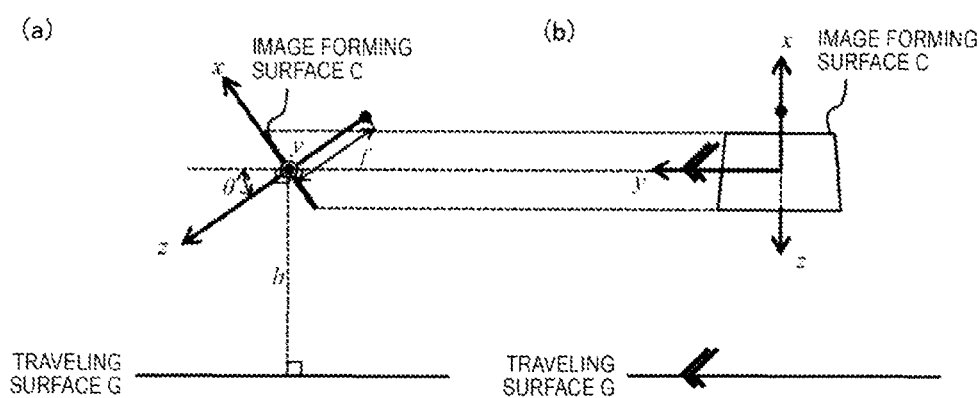
[Fig. 4]
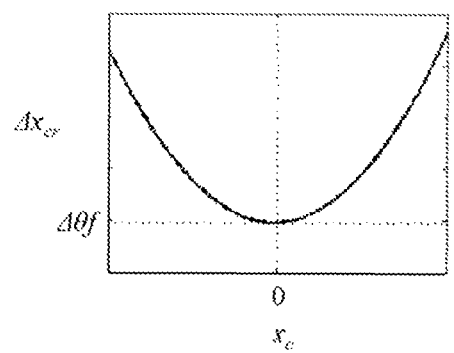

[Fig. 5]
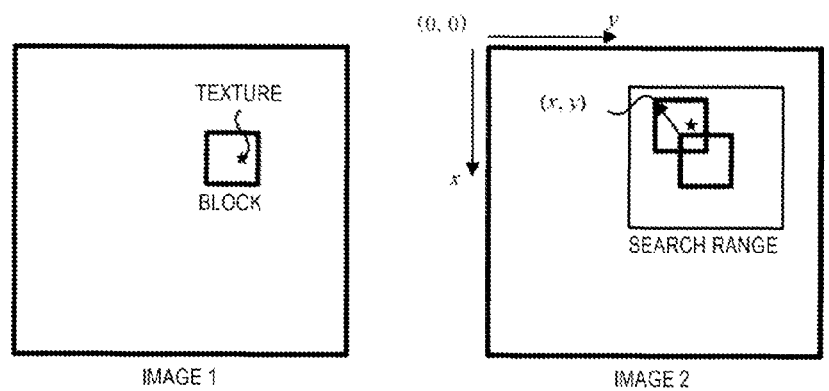
[Fig. 6]
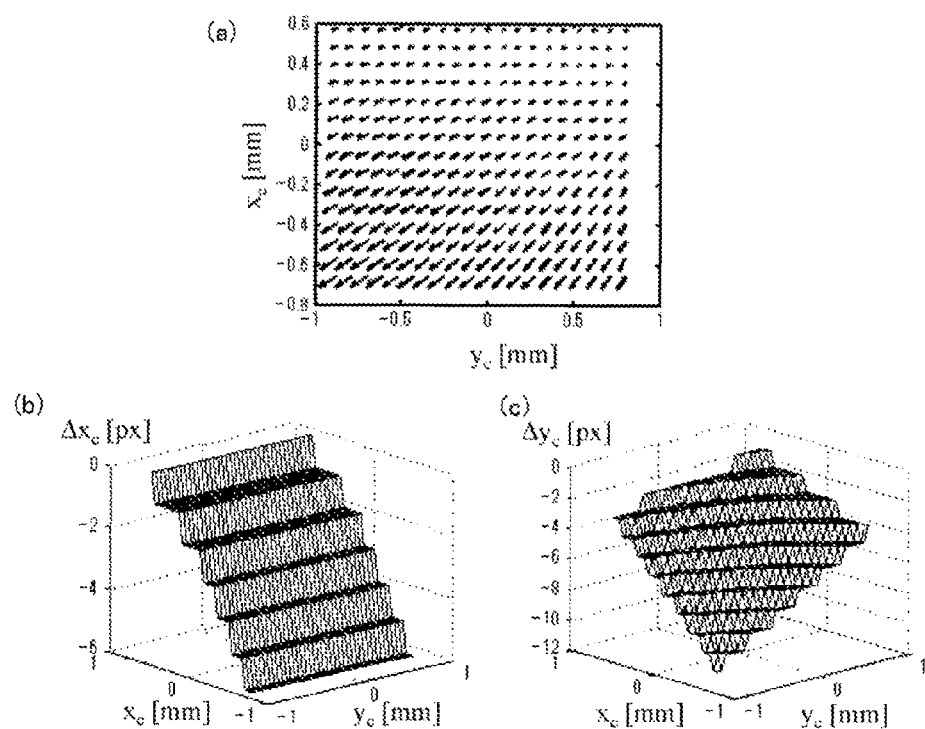

[Fig. 7]
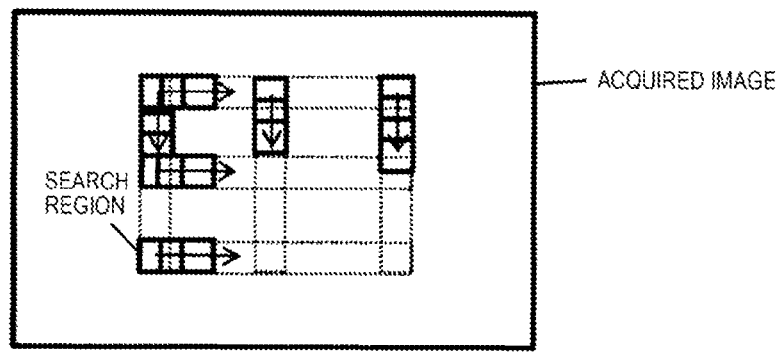
[Fig. 8]
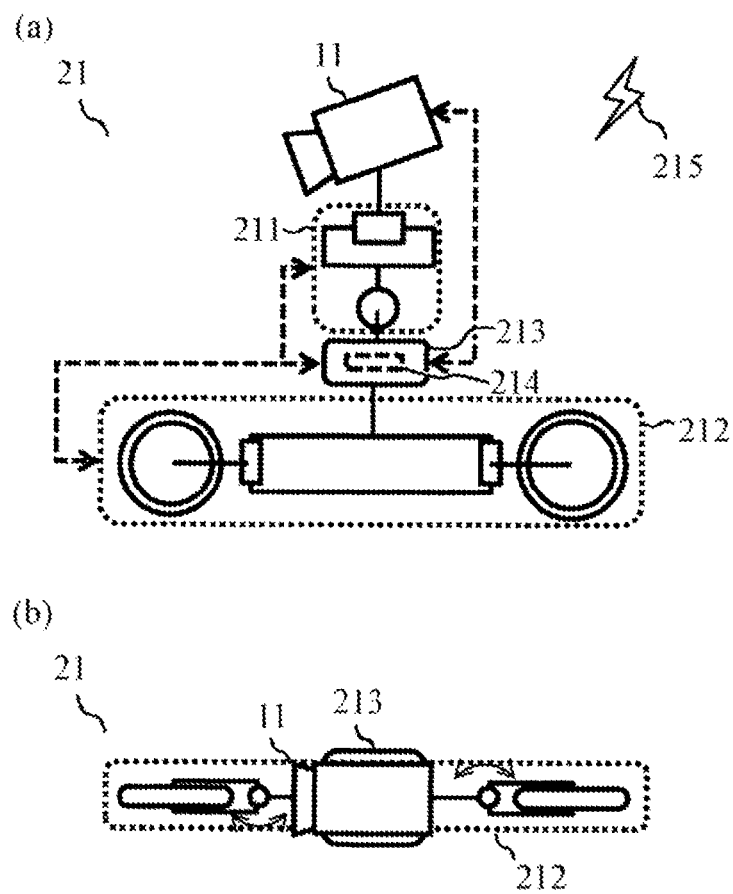

[Fig. 9]
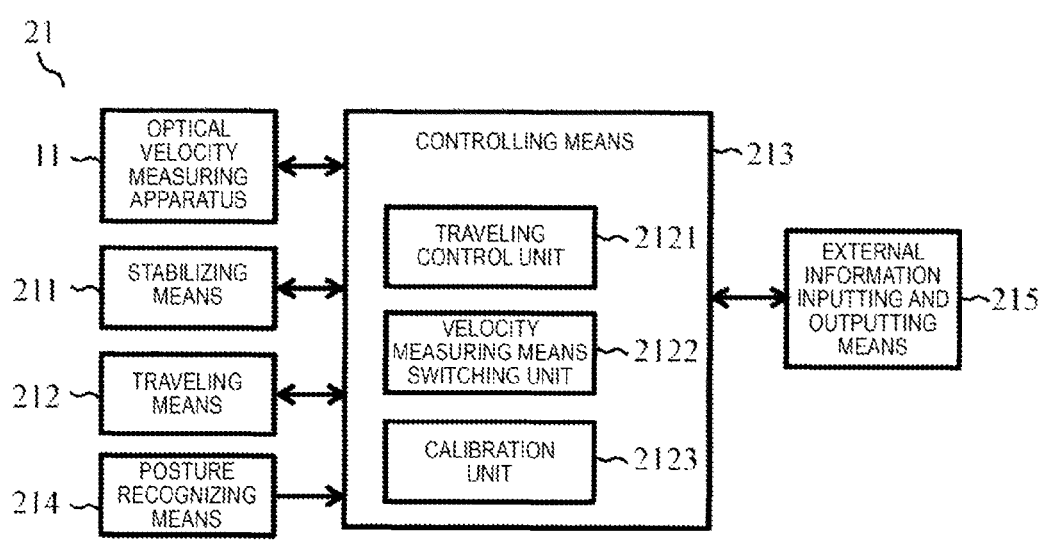

[Fig. 10]
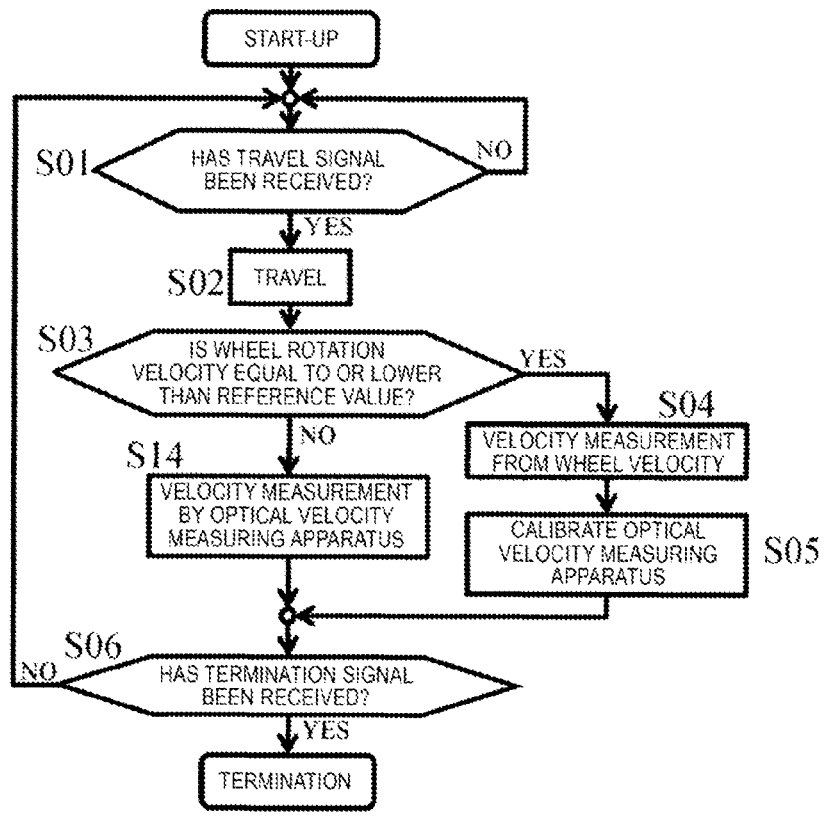
[Fig. 11]
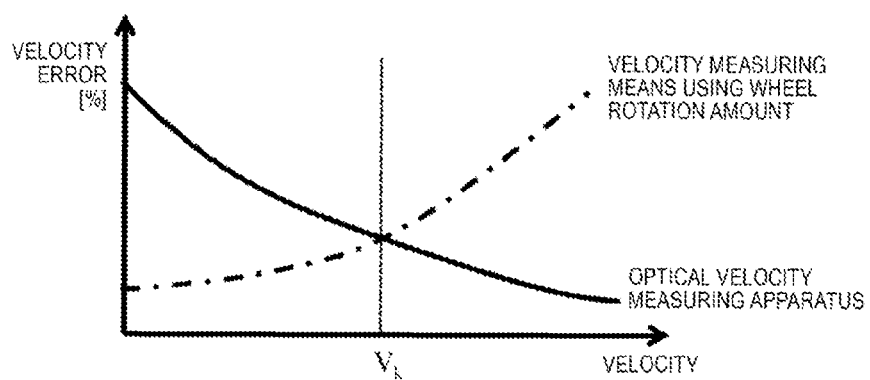

OPTICAL VELOCITY MEASURING APPARATUS AND MOVING OBJECT

TECHNICAL FIELD

The present invention relates to an optical velocity measuring apparatus and a moving object.

BACKGROUND ART

It is necessary to measure an exact velocity of a moving object in order to appropriately control the moving object. There is a velocity measuring apparatus, as a moving object velocity measuring apparatus, which acquires a rotation amount of wheels and calculates a velocity based on a shifting distance calculated from the rotation amount.

However, the apparatus can be used only for a moving object provided with wheels. In addition, even if there is a moving object provided with wheels, in some cases, an exact velocity cannot be measured due to an effect of wheels slipping. A velocity measuring apparatus that calculates a velocity by continuously imaging the around or the like with a digital camera and acquiring a pixel shift amount within the captured image is known.

For instance, a velocity measuring apparatus according to claim 1 of Japanese Patent No. 5304064 (PTL 1) "includes: imaging means that has an imaging element provided with a plurality of pixels; position information detecting means for detecting image information positions that are positions of captured pixels, which are a plurality of pieces of image information imaged by the imaging element, on the imaging element; imaging range calculating means for calculating, for each of the pixels, a range which is captured by the pixels and of which a size differs depending on a distance from the imaging means in a moving direction as an imaging range; shifting distance calculating means for calculating, for each piece of the imaging information, a maximum shifting distance L1 and a minimum shifting distance L2 of the image information based on sizes of a plurality of the imaging ranges corresponding to each of the plurality of pixels and the image information position before and after a predetermined period of time detected by the position information detecting means; and velocity information calculating means for calculating a maximum shifting velocity V1 from the maximum shifting distance L1 and a minimum shifting velocity V2 from the minimum shifting distance L2 for each of the plurality of pieces of image information, for calculating a minimum value V1min out of a plurality of maximum shifting velocities V1 calculated from the plurality of pieces of image information and a maximum value V2max out of a plurality of the minimum shifting velocities V2 calculated from the plurality of pieces of image information, and for calculating velocity information based on the calculated minimum value V1min and maximum value V2max".

CITATION LIST

Patent Literature

PTL 1: Japanese Patent No. 5304064

SUMMARY OF INVENTION

Technical Problem

Since a number of moving objects rotate and vibrate when shifting, an imaging range of imaging means provided in a moving object invariably changes. Accordingly, the imaging range calculating means of the velocity measuring apparatus disclosed in PTL 1 is always required to calculate an imaging range at the time of shifting. In order to calculate the imaging range at any time, a sensor constantly acquires a posture of the imaging means or the moving object. However, since a value measured by the sensor includes an error in general, the accuracy of the imaging range deteriorates, and thus the accuracy of the calculated velocity of the velocity measuring apparatus declines. Accordingly, a velocity measuring apparatus provided in a moving object of which rotational motion has a smaller effect on velocity measurement results is preferable.

Therefore, an object of the invention is to provide an optical velocity measuring apparatus and the like, which can restrict the effect of rotational motion of a moving object and can estimate a velocity of its own with high accuracy, for a moving object with no wheels or a moving object of which the wheels slip.

Solution to Problem

As means for addressing the aforementioned problem, an optical velocity measuring apparatus "includes, for example, imaging means, provided in a moving object, for imaging a traveling surface such that a shift amount of each pixel at a time when an imaging target surface has shifted varies depending on a position of the pixel within an image and calculating means for acquiring, as a pixel shift amount gradient, a change in the shift amount of each pixel with respect to a predetermined axis, from a plurality of images captured by the imaging means in a time series, and for acquiring a velocity of the moving object from the pixel shift amount gradient".

Advantageous Effects of Invention

According to the invention, it is possible to provide an optical velocity measuring apparatus and the like, which can restrict the effect of rotational motion of a moving object and can estimate a velocity of its own with high accuracy, for a moving object with no wheels or a moving object of which the wheels slip.

BRIEF DESCRIPTION OF DRAWINGS

FIG. 1 is a diagram illustrating an outline of an apparatus according to a first embodiment.

FIG. 2 is a diagram illustrating a configuration of the apparatus according to the first embodiment.

FIG. 3 is a diagram illustrating a coordinate system according to the first embodiment.

FIG. 4 is a diagram illustrating a pixel shift amount generated by a pitch-motion of an imaging device.

FIG. 5 is a diagram illustrating a block matching method.

FIG. 6 illustrates an example of a pixel shift amount vector field.

FIG. 7 illustrates an example of a method for setting a search region according to a blocking matching.

FIG. 8 is a configuration diagram of a moving object according to a second embodiment.

FIG. 9 is a system configuration of the moving object according to the second embodiment.

FIG. 10 illustrates an operation flow of controlling means.

FIG. 11 is a diagram illustrating a velocity at a time of velocity measuring means switching.

DESCRIPTION OF EMBODIMENTS

Hereinafter, embodiments will be described with reference to the drawings.

First Embodiment

In this embodiment, an example of an optical velocity measuring apparatus according to the invention will be described.

First of all, with reference to FIG. 1, the outline of the optical velocity measuring apparatus according to the embodiment will be described, and details thereof will be described later. For example, the apparatus is provided with a camera, as imaging means, which is attached to a moving object. For instance, the camera images a road surface, while being shifted, in an obliquely forward direction at a predetermined time interval as illustrated in FIG. 1(a). Once vectors of shift amounts of pixels at a plurality of points on the image (hereinafter, referred to as pixel shift amount vector) are calculated from a plurality of captured images, a distribution of pixel shift amount vectors (hereinafter, referred to as pixel shift amount vector field) within the image is acquired as illustrated in FIG. 1(b). In a number of related methods (for example, PTL 1), a shift amount of the camera with respect to the road surface is calculated through inverse operation based on the pixel shift amount after acquiring a positional relationship between the road surface and the camera through calibration or on an assumption that the positional relationship between the road surface and the camera is constant. However, in he above methods, an exact velocity cannot be calculated in a case where an exact positional relationship cannot be acquired due to rotational vibration of the camera. On the contrary, according to the present method, a velocity is calculated from, instead of a value of the pixel shift amount, a gradient of a predetermined straight line in a pixel shift amount vector field (hereinafter, referred to as pixel shift amount gradient). Accordingly, the effect of a change in the positional relationship on velocity calculation results is small, and thereby the velocity can be calculated with high accuracy compared to the related methods insofar as the change in the positional relationship is equal to or smaller than a certain amount. For instance, after observing the pixel shift amount vectors of a column L within the captured image in FIG. 1(b), the pixel shift amounts of the column L in an x-direction are drawn into a graph having a certain gradient as illustrated in FIG. 1(c). The gradient in the graph changes as the velocity changes. For example, as for the gradient at the time of velocity v1, the Gradient at the time of v1 is steeper than the gradient at the time of a velocity which satisfies v2<v1. In addition, in a case where the camera has minutely pitch-rotated at the velocity of v1, the line shifts in parallel within the graph, maintaining nearly the same gradient as in a case where the camera has shifted without rotation at v1. Although details will be described later, in the invention, by acquiring a velocity at which the moving object shifts in a forward and backward direction and in a right and left direction (hereinafter, simply referred to as velocity) from the gradient, the velocity can be calculated without being affected by rotational motion of the moving object.

FIG. 2 is an example of a configuration diagram of an optical velocity measuring apparatus 11 according to the embodiment. The apparatus 11 includes imaging means 111 for capturing an image of the external environment and information exchanging means 112 for transmitting and receiving trigger signals for starting and terminating calculation, information required for velocity calculation, velocity calculation results, and log information. A captured image obtained from the imaging means 111 and information obtained from the information exchanging means 112 are sent to calculating means 113 for calculating a velocity. The calculating means 113 includes a pixel shift amount calculation unit 1131 that calculates, from a plurality of captured images, shift amounts of a plurality of pixels within the image, a pixel shift amount gradient calculation unit 1132 that calculates a pixel shift amount gradient from the plurality of pixel shift amounts obtained from the calculation unit 1131, and a velocity calculation unit 1133 that calculates a velocity of a moving object 12 from the pixel shift amount gradient obtained from the calculation unit 1132. The velocity calculated by the calculating means 113, log information, and the like are delivered to the outside via the information exchanging means 112. Specifically, the calculating means 113 is configured of a CPU and a memory, and is realized by a variety of programs read from the memory being executed by the CPU. FIG. 2 is a functional block diagram that shows a variety of programs, such as the pixel shift amount calculation unit 1131, the pixel shift amount gradient calculation unit 1132, and the velocity calculation unit 1133, executed by the CPU.

Hereinafter, each of configurations of the optical velocity measuring apparatus 11 will be described.

The imaging means 111 has a plurality of imaging elements, and measures a luminance value of each of the imaging elements. For instance, a charge coupled device (CCD) or a complementary metal oxide semiconductor (CMOS) camera can be appropriately used. In addition, the imaging means 111 images an imaging target surface at a predetermined rate (frame rate) F. At this time, the imaging means is provided such that a shift amount of each pixel at the time when the imaging target surface has shifted varies depending on a position within the image. For instance, when the imaging means is obliquely provided with respect to the imaging target surface, the further away the imaging target surface is located, the smaller a pixel shift amount becomes, and the nearer the imaging target surface is located, the greater a pixel shift amount becomes. Alternatively, different areas of from the imaging target surface may be imaged at the same time by a camera lens being devised or a reflector or the like being used or a plurality of cameras being synchronously used. The frame rate of the imaging means is appropriately set within a range in which calculating a pixel shift amount is possible. For example, in a case where the velocity of the moving object is high, a pixel shift amount per unit time is large and thus the pixel under observation shifts to the outside of the next image (frame-out). Therefore, the shift amount of the pixel cannot be acquired in some cases. Accordingly, for example, the higher an immediately preceding velocity or an average velocity of the moving object, the faster a frame rate becomes. In addition, there is a method through which frame-out of the pixel under observation is prevented by, for instance, setting an orientation in which the imaging means is provided such that a further away area is imaged when the immediately preceding velocity or the average velocity of the moving object increases. The image captured by the imaging means 111 is input to the calculating means 113.

The calculating means 113 includes, for example, a read only memory (ROM) in which a program or firmware is stored, a random access memory (RAM) as a memory unit, and a control unit that executes the program stored in the ROM. As the control unit, for example, a central processing unit (CPU), a graphics processing unit (GPU), a field programmable gate array (FPGA), or the like is appropriately used. The calculating means 113 calculates a velocity of the moving object, and sends the calculated velocity to the information exchanging means 112.

The information exchanging means 112 is a device that transmits and receives signals in a wired or a wireless manner, and a variety of digital or analog input/output (IO) ports and devices are appropriately used. For example, camera posture information, a target velocity of the moving object, a signal indicating the start of calculation, or the like is transmitted to the calculating means 113 via the information exchanging means 112. In addition, for instance, the calculated velocity, debug information of various devices, a response signal with respect to an input signal, or the like is transmitted to the outside of the apparatus 11.

Hereinafter, a velocity calculation method will be described.

A coordinate system illustrated in FIG. 3 will be introduced for explanation. As illustrated in FIG. 3(a), the camera is attached to the moving object at a pitch-angle θ with respect to an orientation in which an optical axis is parallel to a traveling surface. As illustrated in FIG. 3(b), the y-axis is provided so as to be parallel to a traveling surface G. The coordinates of the origin are a point of intersection of an image forming surface C and the optical axis of the lens. F is a focal length of the lens. The pixel shift amount in a case where the moving object has shifted along the traveling surface of this time will described.

The pixel shift amount is regarded as a shift amount of any point on the traveling surface which has been projected onto the image forming surface C. In a case where the moving object has shifted, without rotation, backward by $\Delta X$ and to the right by $\Delta Y$ along the traveling surface G, any point $M_0 = (x, y)$ on the traveling surface G relatively shifts forward by $\Delta X$ and to the left by $\Delta Y$. When the traveling surface G is expressed as Equation 1, a projection point $M_{c0} = (x_c, y_c)$ acquired by $M_0$ being projected onto the image forming surface C is expressed as Equation 2.

$$z = ax + by + c \qquad \text{[Equation 1]}$$

$$\begin{bmatrix} x_c \\ y_c \end{bmatrix} = \frac{f}{ax + by + c} \begin{bmatrix} x \\ y \end{bmatrix} \qquad \text{[Equation 2]}$$

In a state illustrated in FIG. 3, when a shift amount in the coordinate system is set to $\Delta x$ and $\Delta y$ with respect to the shift amount $\Delta X$ and $\Delta Y$ of $M_0$ on the traveling surface G, $\Delta x$ is proportional to $\Delta X$, and $\Delta y$ is equal to $\Delta Y$. Accordingly, when a proportionality constant of $\Delta x$ is set to C, shift amounts $\Delta x_{ct}$ and $\Delta y_{ct}$ on the image forming surface C of the projection point $M_{c0}$ are expressed as Equation 3.

$$\begin{bmatrix} \Delta x_{ct} \\ \Delta y_{ct} \end{bmatrix} = \begin{bmatrix} \frac{dx_c}{dx} C\Delta x + \frac{dx_c}{dy} \Delta y \\ \frac{dy_c}{dx} C\Delta x + \frac{dy_c}{dy} \Delta y \end{bmatrix} \qquad \text{[Equation 3]}$$

Once Equation 2 is substituted into Equation 3 and then rearranged, each of differential terms of Equation 3 is expressed as Equation 4.

$$\frac{d}{dx}\begin{bmatrix} x_c \\ y_c \end{bmatrix} = \frac{f}{(ax+by+c)^2} \begin{bmatrix} by+c \\ -ay \end{bmatrix}, \qquad \text{[Equation 4]}$$

$$\frac{d}{dy}\begin{bmatrix} x_c \\ y_c \end{bmatrix} = \frac{f}{(ax+by+c)^2} \begin{bmatrix} -bx \\ ax+c \end{bmatrix}$$

Since the traveling surface G is parallel to the y-axis, b is 0. Once b is set to 0 and Equation 4 is substituted into Equation rearranging gives Equation 5.

$$\begin{bmatrix} \Delta x_{cr} \\ \Delta y_{cr} \end{bmatrix} = \begin{bmatrix} C\Delta x \frac{(f - ax_c)^2}{fc} \\ C\Delta x \frac{y_c(ax_c - f)}{fc} + \Delta y \frac{f - ax_c}{c} \end{bmatrix} = \qquad \text{[Equation 5]}$$

$$\begin{bmatrix} A_2 x_c^2 + A_2 x_c + A_0 \\ B_2 x_c y_c + B_2 x_c + B_2 y_c + B_0 \end{bmatrix}$$

Hereinbefore, a pixel shift amount in the case where the moving object has shifted without rotation has been described. On the other hand, pixel shift amounts $\Delta x_{cr}$ and $\Delta y_{cr}$ at the time when the camera has rotated, without shifting, by $\Delta\phi$ in a roll direction, $\Delta\theta$ in a pitch direction, and $\Delta\psi$ in a yaw direction are expressed as the following Equation. However, $\Delta\phi$, $\Delta\theta$, and $\Delta\psi$ are minute values.

$$\begin{bmatrix} \Delta x_{cr} \\ \Delta y_{cr} \end{bmatrix} = \begin{bmatrix} -y_c \Delta\varphi + \frac{\Delta\theta(f^2 + x_c^2)}{f - x_c \Delta\theta} \\ x_c \Delta\varphi + \frac{\Delta\psi(f^2 + y_c^2)}{f - y_c \Delta\psi} \end{bmatrix} \qquad \text{[Equation 6]}$$

From the above, pixel shift amounts $\Delta x_c$ and $\Delta y_c$ in a case where the moving object is rotated and shifted are expressed as Equation 7 obtained by adding Equation 5 and Equation 6 together.

$$\begin{bmatrix} \Delta x_c \\ \Delta y_c \end{bmatrix} = \begin{bmatrix} C\Delta x \frac{(f - ax_c)^2}{fc} - y_c \Delta\varphi + \frac{\Delta\theta(f^2 + x_c^2)}{f - x_c \Delta\theta} \\ C\Delta x \frac{y_c(ax_c - f)}{fc} + \Delta y \frac{f - ax_c}{c} + x_c \Delta\varphi + \frac{\Delta\psi(f^2 + y_c^2)}{f - y_c \Delta\psi} \end{bmatrix} \qquad \text{[Equation 7]}$$

Hereinafter, it will be described that the velocity of the moving object can be estimated from a gradient on the x-axis in the shift amount vector field and a gradient on the y-axis in the shift amount vector field when $x_c$ and $y_c$ are assumed as variables.

Since $y_c$ is 0 on the x-axis, Equation 7 is expressed as the following Equation.

$$\begin{bmatrix} \Delta x_c \\ \Delta y_c \end{bmatrix} = \begin{bmatrix} C\Delta x \frac{(f - ax_c)^2}{fc} + \frac{\Delta\theta(f^2 + x_c^2)}{f - x_c \Delta\theta} \\ \Delta y \frac{f - ax_c}{c} + x_c \Delta\varphi + \Delta\psi f \end{bmatrix} \qquad \text{[Equation 8]}$$

A second term of $\Delta x_c$ in Equation 8 is a pixel shift amount as a result of pitch-rotation. FIG. 4 illustrates an example of the second term drawn into a graph. As illustrated in FIG. 4, a pixel shift amount $\Delta x_{cr}$ the x-direction as a result of pitch-rotation is expressed as a substantially verticallysymmetrical graph with x=0 and y=Δθf as minimum values. Accordingly, in the graph, a gradient between two points with x=0 in the middle invariably becomes nearly 0. On the other hand, since a first term of $\Delta x_c$ has the top at f/a and is a quadratic function which is convex downward, the first term changes monotonically in the vicinity of x=0 once f/a deviates from 0. Accordingly, when two points that are equidistant from each other with x=0 in the middle are selected, a gradient between the two points, that is the sum of the first term and the second term, is invariably nearly the same with the gradient of the first term only. In addition, it is evident that the gradient of the first term is proportional to the pixel shift amount Δx. Accordingly, when the gradient of $\Delta x_c$ with respect to the known shift amount of the moving object is recorded, a forward shift amount of the moving object is acquired based on the recorded gradient. By the forward shift amount being divided by time taken for the shift, a forward shift velocity of the moving object is acquired.

In addition, since $x_c$ is 0 on the y-axis, Equation 7 is expressed as the following Equation.

$$\begin{bmatrix} \Delta x_c \\ \Delta y_c \end{bmatrix} = \begin{bmatrix} C\Delta x \frac{f}{c} - y_c \Delta\varphi + \Delta\theta f \\ -C\Delta x \frac{y_c}{c} + \Delta y \frac{f}{c} + \frac{\Delta\psi(f^2 + y_c^2)}{f - y_c \Delta\psi} \end{bmatrix} \quad \text{[Equation 9]}$$

In Equation 9, the gradient of $\Delta x_c$ is $-\Delta\varphi$. Accordingly, once a gradient is acquired from a plurality of points of $\Delta x_c$ on the y-axis, a rotation amount Δφ in the roll direction is acquired. Once $x_c\Delta\varphi$ is calculated from the acquired Δφ and then $x_c\Delta\varphi$ is subtracted from $\Delta y_c$ of Equation 8, Equation 10 is derived.

$$\Delta y_c = \Delta y \frac{f - ax_c}{c} + \Delta\psi f \quad \text{[Equation 10]}$$

In Equation 10, it is evident that $\Delta y_c$ is proportional to a horizontal shift amount ΔY of the moving object. Accordingly, once a gradient of $\Delta y_c$ with respect to the known shift amount of the moving object is recorded, the horizontal shift amount of the moving object is acquired based on the recorded gradient. By dividing the horizontal shift amount by time taken for the shift, a horizontal velocity of the moving object is acquired.

Hereinbefore, it has been described that the shift amount of the moving object can be calculated by using the gradient of the pixel shift amount. Whatever orientation the camera attached to the moving object faces, a similar calculation can be performed by a gradient of a line of intersection between a plane which passes through the optical axis of the camera and is perpendicular to the traveling surface G and the image forming surface C being used and by a gradient of a straight line on the image forming surface C which passes through the optical axis of the camera and which is perpendicular to the line of intersection being used. In addition, the rotation amount of the moving object can be calculated from, for example, Equation 8 or the like by various coefficients of the traveling surface G calculated from a posture of the camera and the acquired ΔX, ΔY, and Δφ being used.

Hereinafter, internal configuration elements of the calculating means 113 will be described.

From a plurality of captured images acquired from the imaging means 111, the pixel shift amount calculation unit 1131 calculates a pixel shift amount at a plurality of points within an image. In the embodiment, a block matching method is used as a method for calculating a pixel shift amount.

FIG. 5 is a diagram illustrating the block matching method. In the block matching method, first of all, a block with a pixel under observation at the center is determined in an image 1. The block incorporates texture unique to the region, such as light and shade and pebbles of a traveling road surface. Next, a search range that has an appropriate size is set in an image 2 which has been captured immediately after the image 1, and a region with a highest degree of similarity to the block is searched. In the embodiment, a sum of squared difference with a low calculation value is used as the degree of similarity. The sum of squared difference refers to a sum of the square of luminance value differences between a block and a comparison target region. Since the more the texture within the block and the texture within the comparison target are similar to each other, the lower luminance value difference becomes, a region with a lowest sum of squared differences can be estimated as the region that matches the block. A sum of squared differences R is expressed as the following Equation.

$$R(x, y) = \sum_{x',y'} \{B(x', y') - S(x+x', y+y')\}^2 \quad \text{[Equation 11]}$$

In this Equation, x and y are natural numbers that indicate a position of a block within a search range, a pixel on the upper left end of the image is set as the origin, and a downward direction is set as the x-axis and the right is set as the y-axis. In addition, when there are w pixels in the horizontal width of the block and h pixels in the vertical width of the block, x'=0, 1, . . . , h and y'=0, 1, . . . , w. R is calculated with respect to x and y within the entire search region, and x and y that result in a lowest R can be estimated as a shift destination of a pixel included in the block within the image 2. By the above being calculated with respect to the block in a plurality of different parts within the image, the pixel shift amount vector field within the image can be calculated. A method for calculating the pixel shift amount vector field is not limited to the aforementioned method. For instance, a method in which a gradient method using a relationship between spatial and temporal gradients of brightness of each point may be employed or a method in which a pixel shift amount is calculated by an edge within the image being detected and then an edge that matches the above edge among a plurality of images captured at different time points being found may be employed.

The pixel shift amount gradient calculation unit 1132 calculates a gradient of the pixel shift amount vector field. FIG. 6 illustrates an example of a pixel shift amount. FIG. 6(*a*) is a pixel shift amount vector field calculated, based on two road surface images captured with a CMOS camera provided in the moving object that shifts on the road surface, by means of the block matching method. Once the captured image is divided into search regions each having a vertically and horizontally regular interval and pixel shift amounts in the x-direction and the y-direction are calculated for all search regions, the pixel shift amount vector field as illustrated in FIG. 6(*a*) is derived. FIG. 6(*b*) illustrates a pixel shift amount $\Delta x_c$ in the x-direction of the pixel shift amount vector field, and FIG. 6(*c*) illustrates a pixel shift amount $\Delta y_c$ in the y-direction in the vector field. The unit of shift amount is pixel. A gradient of any straight line in the vector field can be calculated by each component in the vector field being monotonically changed to the pixel accuracy and by a curved plane function or a plane function being fitted to the vector field as illustrated in FIGS. 6(b) and 6(c). As a method for fitting a function, for example, a multi-parameter fitting or the like described in Non Patent Literature (GNU Scientific Library Reference Manual (v1.12), pp 446-448) may be appropriately used.

When a function is fitted to the pixel shift amount vector field, the pixel shift amount vector of the entire image is not required. According to Non Patent Literature, for example, in a case of plane function-fitting, it is preferable to have pixel shift amount vectors of at least three parts. Accordingly, for example, by acquiring a pixel shift amount vector with respect to the search region illustrated in FIG. 7 and using only a pixel shift amount vector of a region with a few imaging noises to perform the fitting, the calculated velocity can be reduced.

The velocity calculation unit 1133 calculates a velocity from the pixel shift amount gradient by means of the velocity calculation method that has already been described.

As illustrated in FIG. 4, the pixel shift amount is affected by the rotation of the camera. Whatever a focal length the camera has, a pixel shift amount which is equal to or greater than $\Delta\theta f$ is generated with respect to pitch-rotation. In a case where a pixel shift amount generated by shift is small, an amount that cannot be ignored is generated. Accordingly, in a case where a velocity is acquired from a pixel shift amount itself as in the related method, the number of errors in velocity measurement results increases when an error occurs in a posture measuring sensor of the camera. On the contrary, the effect of rotational vibration is rarely found in the optical velocity measuring apparatus according to the invention. Therefore, for example, in a case where the optical velocity measuring apparatus is fixed to a vehicle or the like, a height from the traveling surface to the camera is nearly constant, and what only occurs is the rotational vibration of the camera around an orientation in which the camera is fixed. Accordingly, an exact velocity can be measured even without a sensor for measuring a camera posture being employed if the apparatus according to the invention is used. In addition, if the apparatus according to the invention is provided in flying apparatuses or the like, the posture measuring sensor becomes necessary since an angle of the imaging means with respect to the ground changes significantly. In this case, since the effect of error in a rotation amount is small, an exact velocity can be measured even when, for example, an affordable posture measuring sensor with a large error is employed.

It is possible to provide the velocity measuring apparatus in which an effect of rotational motion of the moving object on velocity measurement results is small, and which can measure an exact velocity of a moving object with no wheels or a moving object of which the wheels slip.

Hereinafter, an example of a moving object which is provided with the aforementioned optical velocity measuring apparatus and which can measure an exact velocity of its own even when a posture of the moving object changes and wheels of the moving object slip or idle will be described. Out of configurations and functions of the optical velocity measuring apparatus 11 in FIG. 1, description on configurations to which the same reference numerals are assigned as that of the configurations illustrated in FIG. 2 and parts that have the same functions illustrated in FIG. 2 will not be repeated.

A structure of a moving object 21 provided with the optical velocity measuring apparatus of the embodiment will be described with reference to FIG. 8. As illustrated in FIG. 8(a), the moving object 21 includes the optical velocity measuring apparatus 11, stabilizing means 211 for holding the optical velocity measuring apparatus substantially horizontal with respect to the traveling surface, traveling means 212, provided with two wheels in series in a front-back direction, for moving the moving object, controlling means 213 for controlling traveling means 212 and processing measurement results, posture recognizing means 214 for recognizing a posture of the moving object, and external information inputting and outputting means 215 for inputting and outputting information of external device.

A system configuration of the moving object 21 will be described with reference to FIG. 9. Velocity measurement results from the optical velocity measuring apparatus 11, roll or pitch angle information from the stabilizing means 211, a wheel rotation velocity and a wheel steering angle from the traveling means 212, posture information of the moving object from the posture recognizing means 214 are transmitted to the controlling means 213. In addition, the wheel rotation velocity and the posture information of the moving object are transmitted from the controlling means 213 to the apparatus 11, and the transmitted information is used in calculating a velocity of the optical velocity measuring apparatus 11. A target pitch or roll angle to stabilize the posture of the optical velocity measuring apparatus 11 substantially in a horizontal direction is transmitted from the controlling means 213 to the stabilizing means 211. A target wheel rotation velocity or target wheel steering angle information is transmitted from the controlling means 213 to the traveling means 212. The external information inputting and outputting means 215 receives a moving object control command from a person or an autonomous control computer, and transmits a current velocity or location of the moving object, log information, and the like to the outside.

The controlling means 213 includes a traveling control unit 2121, a velocity measuring means switching unit 2122, and a calibration unit 2123 on the inside thereof. The traveling control unit 2121 controls the moving object such that the moving object does not overturn in the roll direction and controls a shift direction and velocity of the moving object or the like based on the posture information of the moving object from the posture recognizing means 214 and the velocity information and shift direction information from the traveling means 212. The velocity measuring means switching unit 2122 switches velocity measuring means in accordance with a wheel rotation velocity of traveling means such that highly accurate velocity measurement results are acquired. The calibration unit 2123 calibrates the optical velocity measuring apparatus 11. Herein, calibration means acquiring a ratio of a pixel shift amount vector gradient described in the first embodiment to a known velocity acquired by other velocity measuring means to a distance from the apparatus 11 to the ground at the time of velocity measurement.

An operation of the controlling means 213 will be described with reference to FIG. 10. First of all, after start-up of the apparatus, once the external information inputting and outputting means 215 receives a travel signal in Step S01, processing proceeds to Step S02 and the traveling means 212 is controlled to cause the moving object 21 to travel. Next, in Step S03, if a wheel rotation velocity is equal to or lower than a predetermined reference value $V_k$, the processing proceeds to Step S04, and if the wheel rotation velocity is not equal to or lower than $V_k$, the processing proceeds to Step S05. In Step S04, a velocity of the moving object is measured from the wheel rotation velocity acquired from the traveling means 212. In Step S05, the optical velocity measuring apparatus 11 is calibrated by the calibration unit 2123. In addition, in Step S14, a velocity is measured by the optical velocity measuring apparatus 11 based on results of calibration conducted in Step S05. In Step S06, in a case where a termination signal is received from the external information inputting and outputting means 215 or in a case where a termination signal caused by an error in any one of configuration elements is received, the operation of the moving object is terminated.

The switching reference value $V_k$ of the velocity measuring means switching unit 2122 will be described with reference to FIG. 11. In FIG. 11, the horizontal axis represents a velocity of the moving object and the vertical axis represents a proportion of error in velocity measurement results with respect to a true velocity value. In general, in measuring a velocity from a wheel rotation amount, a proportion of error increases as a velocity of the moving object increases since occurrence of deformation or slip of wheels increases. On the other hand, an error in the optical velocity measuring apparatus 11 is caused by a pixel shift amount being calculated to the pixel accuracy in principle, and a constant amount of the error invariably occurs regardless of a shift velocity. For instance, in a case where an error is always included for a velocity of 1 km per hour, an error at the time when a velocity is 100 km per hour is 1% while an error at the time when a velocity is 10 km per hour is 10%. As described above, since a proportion of error in the velocity measuring means for calculating a velocity from a wheel rotation amount varies inversely as a proportion of error in the optical velocity measuring apparatus 11 with respect to a velocity, a velocity $V_k$ at which a proportion of error in the velocity measuring means and a proportion of error in the optical velocity measuring apparatus 11 are reversed exists as illustrated in FIG. 11. Therefore, it is possible to measure a velocity with high accuracy over a wide velocity range by the velocity measuring means for calculating a velocity from a wheel rotation amount being used in a case where a velocity of the moving object is lower than $V_k$ and by the optical velocity measuring apparatus 11 being used in a case where a velocity of the moving object is equal to or higher than $V_k$.

In addition, by the optical velocity measuring apparatus, which is not being used, being calibrated when measuring a velocity from a wheel rotation amount, time and efforts that are spent on conducting an operation only for calibration before using the moving object reduces.

A method for calculating a velocity from calibration results will be described. According to Equation 8, a pixel shift amount gradient is proportional to a velocity, and is inversely proportional to a coefficient c. The coefficient c is an intercept at which the traveling surface G intersects with the z-axis of the coordinate system. In addition, the coefficient c is proportional to a distance between the imaging means 111 and the traveling surface G. From the above, the velocity can be calculated through the following Equation.

$$\begin{bmatrix} v_x \\ v_y \end{bmatrix} = \frac{1}{c'} \begin{bmatrix} K_x p_x \\ K_y p_y \end{bmatrix}$$ [Equation 12]

In the above Equation, c' is the coefficient c or an amount that is proportional to the coefficient c, $v_x$ is a velocity in the forward direction, $v_y$ is a velocity to the left, $p_x$ is a pixel shift amount gradient in the x-direction, $p_y$ is a pixel shift amount gradient in the y-direction, and $K_x$ and $K_y$ are the proportionality constants acquired by calibration. The proportionality constants $K_x$ and $K_y$ are acquired by a known x-direction velocity $v_{x0}$, y-direction velocity $v_{y0}$, and coefficient c or amount $c_0'$ that is proportional to the coefficient c, all of which have been recorded at the time of calibration and an x-direction pixel shift amount gradient $p_{x0}$ and y-direction pixel shift amount gradient $p_{y0}$, all of which have been measured being used in the following Equation.

$$\begin{bmatrix} K_x \\ K_y \end{bmatrix} = c_0' \begin{bmatrix} \frac{v_{x0}}{p_{x0}} \\ \frac{v_{y0}}{p_{y0}} \end{bmatrix}$$ [Equation 13]

The coefficient c can be acquired from, for example, a geometric relationship between a posture of the moving object 21 obtained by the posture recognizing means and the imaging means 111 of the optical velocity measuring apparatus 11. Alternatively, a distance between the imaging means 111 and the traveling surface G is used as an amount that is proportional to the coefficient c. The distance may be measured by a sensor, such as a laser sensor and an ultrasonic sensor, provided in the moving object 21 being appropriately used.

The stabilizing means 211 operates such that a roll angle of the apparatus 11 is substantially horizontal with respect to the traveling surface based on a control signal from the controlling means 213 since the stabilizing means 211 can control a posture of the optical velocity measuring apparatus 11 in a pitch or roll direction. Although the stabilizing means 211 is not necessarily required to measure a velocity, using the stabilizing means 211 can simplify the calculation since the pixel shift amount gradient on the x-axis and the y-axis of the image forming surface can be used.

The traveling means 212 can steer front and back wheels independently of each other as illustrated in FIG. 8(b), thereby shifting the moving object based on a control signal from the controlling means 213. In the embodiment, although the traveling means having a two-wheel mechanism is given as an example of the moving object of which a posture changes during traveling, the traveling means is not limited to this example. Any means may be used insofar as the means changes the position of the moving object. For instance, beginning with wheels having a three-wheel mechanism or a four-wheel mechanism, a crawler, a support leg, and a hover may be used. Alternatively, in place of the traveling means, for example, a propeller, a blade, a jet, a parachute, and other flying means may be used. In addition, for instance, a rail mechanism and a suction mechanism for shifting along a wall or a ceiling may be used.

The controlling means 213 includes, for example, a ROM in which a program or firmware is stored, a RAM as a memory unit, and a CPU, as a control unit, which executes the program stored in the ROM.

As described above, in the embodiment, it is possible to provide a velocity measuring apparatus in which effect of rotational motion of a moving object on velocity measurement results is small, and which can measure an exact velocity of the moving object with no wheels or a moving object of which the wheels slip. In addition, it is possible to provide a moving object which is provided with the velocity measuring apparatus, and which can estimate an exact velocity of its own regardless of slipping or idling of the wheels and presence or absence of wheels. A surface to be an imaging target is not limited to the ground. Insofar as a surface of which a positional relationship with the camera is known, any surface becomes the target. For instance, a ground surface, a wall of a building, a ceiling, a water surface, a top plate for a table and the like may become the target. In particular, it is expected to be applicable to a ship or a flying object which shifts without wheels being used.

The invention is not limited to the aforementioned embodiment, and includes various modification examples. For instance, the aforementioned embodiment is a detailed description to promote understanding on the invention, and the aforementioned embodiment is not to limit the invention to a form having all and every configuration described herein. In addition, a part of a configuration of a certain embodiment can substituted with a configuration of different embodiments, and a configuration of a certain embodiment can be added with a configuration of other embodiments. In addition, a part of a configuration of each embodiment can be added with different configurations, be deleted, and be substituted by different configurations.

In addition, each of the aforementioned configurations, functions, processing units, processing means, and the like may be realized in the form of hardware such as an integrated circuit which is designed so as to incorporate a part or the whole of the above. In addition, the aforementioned configurations, functions, and the like may be realized in the form of software by interpreting and executing a program in which a processor realizes each function. Information, such as a program, a table and a file to realize each function, can be written in a recording device including a memory, a hard disk, and a solid state drive (SSD) or in a recording medium including an IC card, an SD card, and a DVD.

In addition, control lines or information lines that are thought to be necessary have been described for the sake of explanation, and not all types of products of control lines or information lines are described herein. It may be considered that practically all configurations are connected to each other in reality.

In addition, although the optical velocity measuring apparatus provided in the moving object has been described in the aforementioned embodiment, the apparatus, for example, can be provided at a fixed point and can be used in measuring a velocity of an imaging target object as well. A shift velocity of the imaging target object can be measured by, for instance, a liquid surface, a sheet-like object, an object sprayed on a sheet, and the like being imaged.

In addition, an indirect imaging may be conducted by the imaging means of the apparatus that captures an image projected from externally provided imaging means onto an image monitor or a screen instead of directly imaging, by the imaging device of the apparatus, an object of which a shift velocity intended to be observed.

REFERENCE SIGNS LIST 11 optical velocity measuring apparatus of first embodiment
111 imaging means
112 information exchanging means
113 calculating means
1131 pixel shift amount calculation unit
1132 pixel shift amount gradient calculation unit
1133 velocity calculation unit
21 moving object of second embodiment
211 stabilizing means
212 traveling means
2121 traveling control unit
2122 velocity measuring means switching unit
2123 calibration unit
213 controlling means
214 posture recognizing means
215 external information inputting and outputting means
$x_c$ x-coordinate on image forming surface of camera
$y_c$ y-coordinate on image forming surface of camera
$\Delta x_c$ pixel shift amount in x-direction
$\Delta y_c$ pixel shift amount in y-direction
$\Delta x$ shift amount in x-direction of imaging target
$\Delta y$ shift amount in y-direction of imaging target
$\Delta X$ shift amount in forward direction of imaging target
$\Delta Y$ shift amount to left of imaging target

The invention claimed is:

1. An optical velocity measuring apparatus comprising: imaging means, provided in a moving object, for imaging a traveling surface such that a shift amount of each pixel at a time when an imaging target surface has shifted varies depending on a position of the pixel within an image; and calculating means for acquiring, as a pixel shift amount gradient, a change in the shift amount of each pixel with respect to a predetermined axis, from a plurality of images captured by the imaging means in a time series, and for acquiring a velocity of the moving object from the pixel shift amount gradient.

2. The optical velocity measuring apparatus according to claim 1,
wherein the pixel shift amount gradient with respect to a known shift amount of the moving object is stored, and
wherein the calculating means acquires a velocity of the moving object from the acquired pixel shift amount gradient and the pixel shift amount gradient with respect to the known shift amount.

3. The optical velocity measuring apparatus according to claim 1,
wherein the imaging means obliquely images the traveling surface such that the shift amount of each pixel at the time when the imaging target surface has shifted varies depending on the position of the pixel within the image.

4. The optical velocity measuring apparatus according to claim 1,
wherein the pixel shift amount gradient acquired by the calculating means refers to a gradient of the pixel shift amount on a line of intersection between a plane which passes through an optical axis of the imaging means and is perpendicular to the traveling surface and an image forming surface of the imaging means and a gradient of the pixel shift amount on a straight line on the image forming surface which passes through the optical axis of the imaging means and which is substantially perpendicular to the line of intersection.

5. The optical velocity measuring apparatus according to claim 1,
wherein the pixel shift amount gradient acquired by the calculating means is calculated based on difference between shift amounts of pixels at positions symmetric about a point of intersection between the optical axis of the imaging means and the image forming surface of the imaging means.

6. A moving object including shifting means for displacing a position of its own and controlling means for controlling the shifting means, the moving object comprising: an optical velocity measuring apparatus that is configured with imaging means for imaging a traveling surface such that a shift amount of each pixel at a time when an imaging target surface has shifted varies depending on a position of the pixel within an image and calculating means for acquiring, as a pixel shift amount gradient, a change in the shift amount of each pixel with respect to a predetermined axis, from a plurality of images captured by the imaging means in a time series, and for acquiring a velocity of the moving object from the pixel shift amount gradient.

7. The moving object according to claim 6, further comprising:
posture recognizing means for recognizing a posture of the imaging means of the optical velocity measuring apparatus,
wherein the calculating means uses the posture information recognized by the posture recognizing means in calibration for velocity measurement of the moving object.

8. The moving object according to claim 6,
wherein the controlling means switches between, depending on the velocity of the moving object, the optical velocity measuring apparatus and a grounded velocity measuring apparatus which has been grounded to the traveling surface.

9. The moving object according to claim 6,
wherein the grounded velocity measuring apparatus is used in a case where a velocity is equal to or lower than a velocity at which a measurement error in the optical velocity measuring apparatus and a measurement error in the grounded velocity measuring apparatus become equal in degree, and the optical velocity measuring apparatus is used in a case where a velocity is equal to or higher than the velocity at which the measurement error in the optical velocity measuring apparatus and the measurement error in the grounded velocity measuring apparatus become equal in degree.

10. The moving object according to claim 6,
wherein the optical velocity measuring apparatus is calibrated while the grounded velocity measuring apparatus is being used.

* * * * *